United States Patent
Arai et al.

(10) Patent No.: US 9,705,009 B2
(45) Date of Patent: Jul. 11, 2017

(54) SEMICONDUCTOR DEVICE

(71) Applicant: Kabushiki Kaisha Toshiba, Minato-ku (JP)

(72) Inventors: Norihisa Arai, Saitama-ken (JP); Tsutomu Takahashi, Kanagawa-ken (JP); Kazunori Masuda, Kanagawa-ken (JP); Kazuo Hatakeyama, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 93 days.

(21) Appl. No.: 14/017,394

(22) Filed: Sep. 4, 2013

(65) Prior Publication Data

US 2014/0284690 A1  Sep. 25, 2014

(30) Foreign Application Priority Data

Mar. 22, 2013  (JP) .................. 2013-061083

(51) Int. Cl.
  *H01L 29/792*  (2006.01)
  *H01L 23/48*  (2006.01)

(52) U.S. Cl.
  CPC .......... *H01L 29/792* (2013.01); *H01L 23/481* (2013.01); *H01L 2924/0002* (2013.01)

(58) Field of Classification Search
  CPC ... H01L 23/481; H01L 23/5384; H01L 23/60; H01L 25/0657; H01L 27/0251;
  (Continued)

(56) References Cited

U.S. PATENT DOCUMENTS 7,943,470 B2  5/2011  Uchiyama et al.
8,138,036 B2  3/2012  Andry et al.
(Continued)

FOREIGN PATENT DOCUMENTS

JP  11-195706 A  7/1999
JP  2008-251964 A  10/2008
(Continued)

OTHER PUBLICATIONS

Office Action issued May 7, 2015 in Japanese Patent Application No. 2013-061083 (with English language translation).
(Continued)

Primary Examiner — Joshua King
Assistant Examiner — Mohammed R Alam
(74) Attorney, Agent, or Firm — Oblon, McClelland, Maier & Neustadt, L.L.P.

(57) ABSTRACT

According to one embodiment, a semiconductor device includes: a semiconductor layer of a first conductivity type, and the semiconductor layer having a first and a second surfaces; a first conductive layer penetrating from the first surface side to the second surface side of the semiconductor layer; a first semiconductor region of a first conductivity type surrounding part of the first conductive layer on the second surface side of the semiconductor layer, a portion other than a front surface of the first semiconductor region being surrounded by the semiconductor layer; and a first insulating film provided between the first conductive layer and the semiconductor layer and between the first conductive layer and the first semiconductor region, a concentration of an impurity element contained in the first semiconductor region being higher than a concentration of an impurity element contained in the semiconductor layer.

13 Claims, 8 Drawing Sheets

(58) Field of Classification Search
CPC ... H01L 2924/12036; H01L 2224/0401; H01L 24/16; H01L 2224/13099; H01L 2225/06541; H01L 2924/13091; H01L 24/05; H01L 2924/30107
See application file for complete search history.

(56) References Cited

U.S. PATENT DOCUMENTS

| | | | | |
|---|---|---|---|---|
| 2006/0043599 | A1* | 3/2006 | Akram | H01L 21/6835 257/774 |
| 2010/0237386 | A1* | 9/2010 | Lin | H01L 23/481 257/173 |
| 2011/0089572 | A1 | 4/2011 | Tezcan et al. | |
| 2012/0080802 | A1* | 4/2012 | Cheng et al. | 257/774 |
| 2012/0248581 | A1* | 10/2012 | Sugiyama et al. | 257/622 |
| 2012/0292746 | A1* | 11/2012 | Lee | H01L 21/76898 257/621 |
| 2013/0264676 | A1* | 10/2013 | Yang | H01L 23/5226 257/508 |
| 2014/0061874 | A1* | 3/2014 | Kim | 257/653 |

FOREIGN PATENT DOCUMENTS

| | | |
|---|---|---|
| JP | 2009-88336 A | 4/2009 |
| JP | 2011-515843 A | 5/2011 |
| JP | 2011-530812 A | 12/2011 |
| JP | 2012-028557 A | 2/2012 |
| JP | 2012-204403 A | 10/2012 |
| WO | WO 2005/086216 A1 | 9/2005 |

OTHER PUBLICATIONS

Japanese Office Action issued on Feb. 26, 2016 in counterpart Japanese patent application No. 2013-061083 with English translation (5 pages).

* cited by examiner

SEMICONDUCTOR DEVICE

CROSS-REFERENCE TO RELATED APPLICATIONS

This application is based upon and claims the benefit of priority from Japanese Patent Application No. 2013-061083, filed on Mar. 22, 2013; the entire contents of which are incorporated herein by reference.

FIELD

Embodiments described herein relate generally to a semiconductor device.

BACKGROUND

A through via (through silicon via, TSV) is introduced as a technology whereby a plurality of semiconductor chips can be mounded at high density. In the case where the semiconductor is silicon (Si), the through via is a conductive layer penetrating from the back surface to the front surface of the silicon substrate, for example. Each of a plurality of semiconductor chips is electrically connected via the through via to mount the plurality of semiconductor chips at high density; thereby, high-speed data transfer is enabled.

The TSV technology is expected to be applied to a semiconductor device such as a NAND flash memory. In such a semiconductor device, a relatively high power supply potential is used in the write and erase operations. Therefore, if the TSV technology is applied to the semiconductor device, a high power supply is supplied also to the through via as a matter of course, and it is feared that a potential difference with an element will occur to cause a yield reduction due to the unstable operation and operational dysfunction of the element. Furthermore, it has been necessary to set a sufficient distance between the through via and the element in order to prevent a yield reduction due to the unstable operation and operational dysfunction of the element, and this has been leading to an increase in the area of the semiconductor chip. For such a semiconductor device, a structure is desired that avoids a yield reduction due to the unstable operation and operational dysfunction of the element caused when a high power supply is supplied also to the through via, and prevents an increase in the chip area of the semiconductor device electrically connected by the through via.

DETAILED DESCRIPTION

Figure 1:
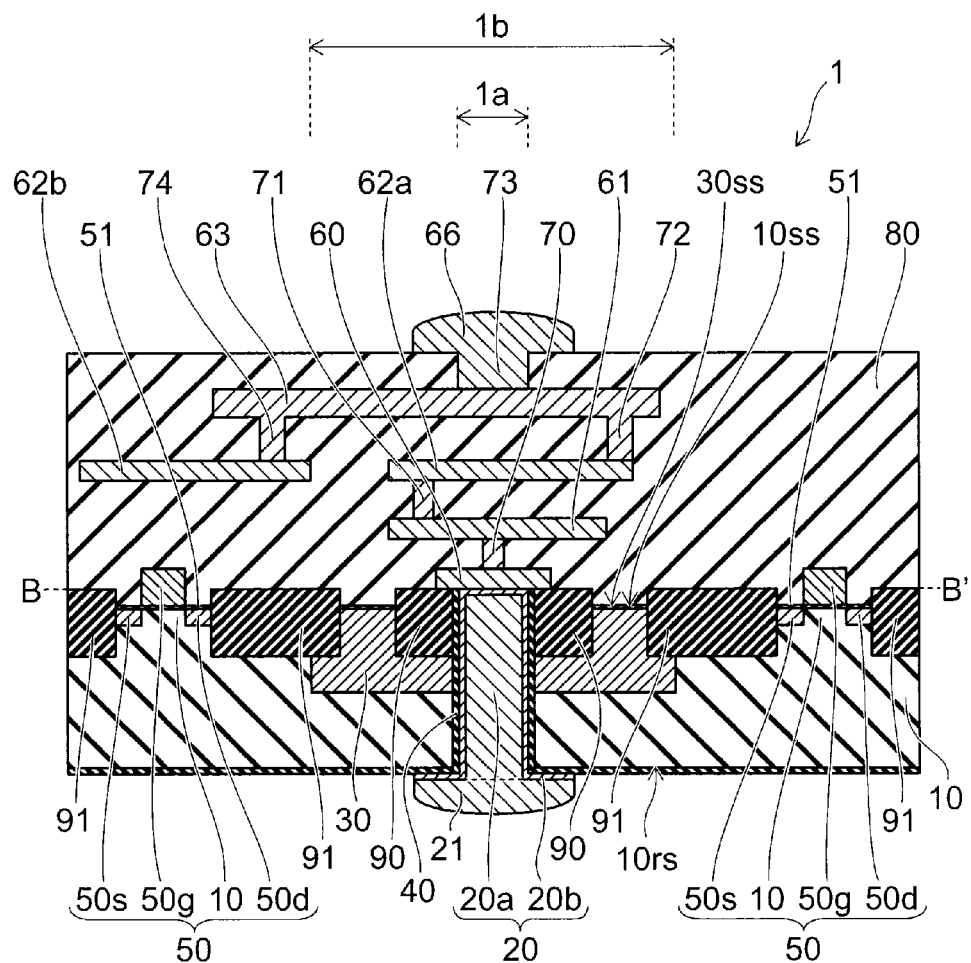
FIG. 1 is a schematic cross-sectional view showing a semiconductor device according to a first embodiment.

In general, according to one embodiment, a semiconductor device includes: a semiconductor layer of a first conductivity type, and the semiconductor layer having a first surface and a second surface on an opposite side to the first surface; a first conductive layer penetrating from the first surface side to the second surface side of the semiconductor layer; a first semiconductor region of a first conductivity type surrounding part of the first conductive layer on the second surface side of the semiconductor layer, a portion other than a front surface of the first semiconductor region being surrounded by the semiconductor layer; and a first insulating film provided between the first conductive layer and the semiconductor layer and between the first conductive layer and the first semiconductor region, a concentration of an impurity element contained in the first semiconductor region being higher than a concentration of an impurity element contained in the semiconductor layer.

Hereinbelow, embodiments are described with reference to the drawings. In the following description, identical components are marked with the same reference numerals, and a description of components once described is omitted as appropriate.

First Embodiment

FIG. 1 is a schematic cross-sectional view showing a semiconductor device according to a first embodiment.

Figure 2:
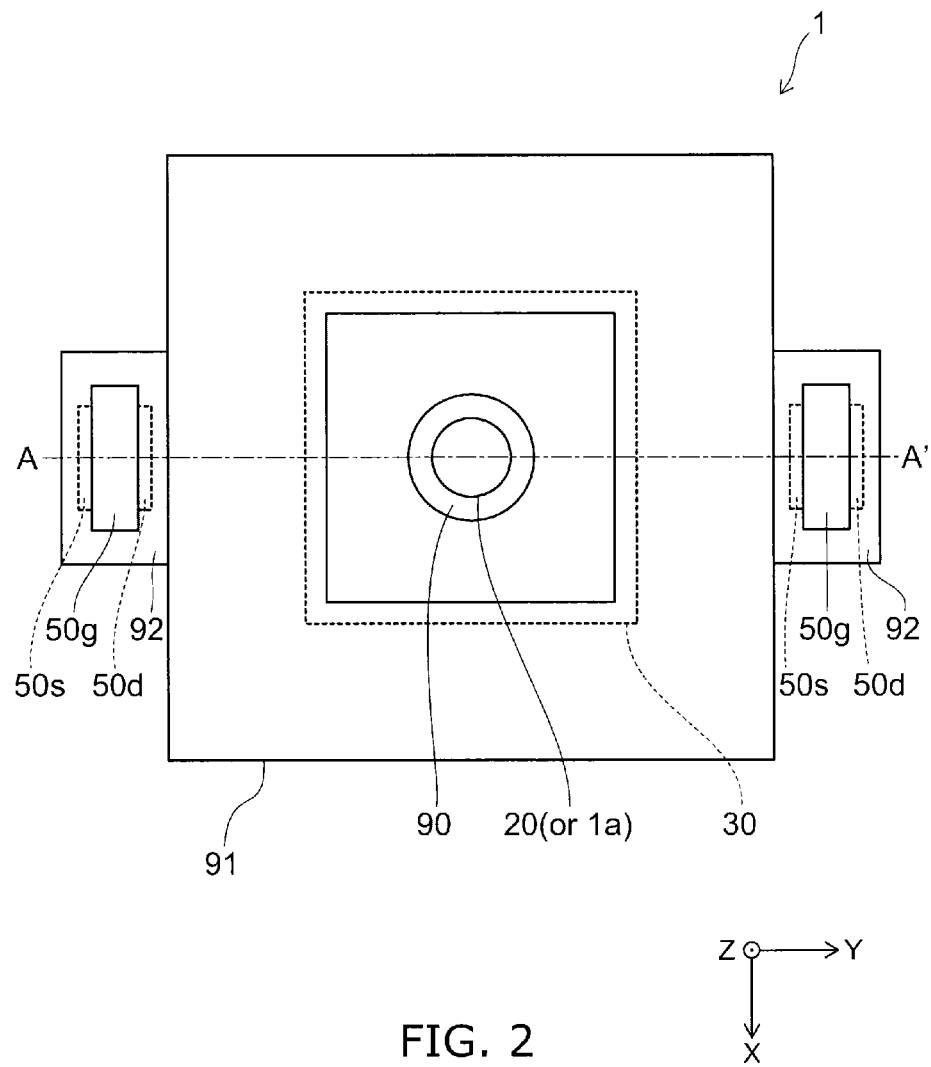
FIG. 2 is a schematic plan view showing the semiconductor device according to the first embodiment.

FIG. 2 is a schematic plan view showing the semiconductor device according to the first embodiment.

FIG. 1 shows a cross section in the position along line A-A' of FIG. 2. FIG. 2 shows a cross section in the position along line B-B' of FIG. 1.

A semiconductor device 1 according to the first embodiment is part of a NAND flash memory device, as an example. The semiconductor device 1 includes a semiconductor layer 10, a conductive layer 20 (a first conductive layer), a semiconductor region 30 (a first semiconductor region), and an insulating film 40 (a first insulating film).

The semiconductor layer 10 is a p-type semiconductor layer. The semiconductor layer 10 has a back surface 10rs (a first surface) and a front surface 10ss (a second surface) on the opposite side to the back surface 10rs. The semiconductor layer 10 is a semiconductor layer formed by processing and thinning a semiconductor substrate such as a semiconductor wafer, for example. The thickness in the Z direction of the semiconductor layer 10 is 20 µm to 50 µm, for example.

The conductive layer 20 penetrates from the back surface 10rs side to the front surface 10ss side of the semiconductor layer 10. That is, the conductive layer 20 is a through via (TSV). In the semiconductor device 1, at least one conductive layer 20 is provided. Thus, the number of conductive layers 20 is not limited to the number illustrated. The number of conductive layers 20 may be one or plural. That is, another conductive layer 20 penetrating from the back surface 10rs side to the front surface 10ss side of the semiconductor layer 10 may be provided. In the first embodiment, a region where at least one conductive layer 20 is provided is referred to as a first region 1a.

The conductive layer 20 has a conductive region 20a and a conductive region 20b. The conductive region 20a is the main body of the conductive layer 20. The conductive region 20b is a barrier layer that suppresses the diffusion of components of the conductive region 20a to the semiconductor layer 10 and the semiconductor region 30. Alternatively, the conductive region 20b functions as an adhesion layer that increases the adhesion between the conductive region 20a and the insulating film 40 provided on the outside of the conductive region 20a. The planar shape of the conductive layer 20 is not limited to a circle but may be a rectangle or a polygon. The conductive layer 20 is connected to an electrode pad 21.

The semiconductor region 30 is a p-type semiconductor region. The conductivity type of the semiconductor layer 10 and the conductivity type of the semiconductor region 30 are the same. The semiconductor region 30 surrounds part (for example, an upper portion) of the conductive layer 20 on the front surface 10ss side of the semiconductor layer 10. In the semiconductor region 30, portions other than the front surface of the semiconductor region 30 (for example, a lower portion and a side portion of the semiconductor region 30) are surrounded by the semiconductor layer 10. In the first embodiment, a region where the semiconductor region 30 is provided is referred to as a second region 1b. The planar shape of the semiconductor region 30 is not limited to a quadrangle but may be a rectangle or a polygon. The semiconductor region 30 may be referred to as a well region.

The concentration of the p-type impurity element contained in the semiconductor region 30 is higher than the concentration of the p-type impurity element contained in the semiconductor layer 10. In the case where the semiconductor device 1 is part of a NAND flash memory device, the impurity concentration of the semiconductor layer 10 is set lower than the impurity concentration of a semiconductor substrate forming an ordinary CMOS or the like.

As the background of this, since a relatively high potential (approximately 25 (V)) is used for the write and erase operations of memory cells, a boost circuit is needed that produces a relatively high potential required for the write and erase operations, and a transistor with a very small back bias effect is needed as an element forming the boost circuit. It is common knowledge that in order to reduce the back bias effect of a transistor, the semiconductor substrate needs to have a very low impurity concentration; and the impurity concentration of the semiconductor layer 10 is $1 \times 10^{14}$ (atoms/cm$^3$), for example. The impurity concentration of the semiconductor region 30 is $2 \times 10^{17}$ (atoms/cm$^3$), for example.

Here, the "impurity concentration" refers to the effective concentration of the impurity element contributing to the electrical conductivity of the semiconductor material. For example, in the case where an impurity element serving as a donor and an impurity element serving as an acceptor are contained in the semiconductor material, the concentration of the activated impurity element excluding the amount of offset between donors and acceptors is taken as the impurity concentration.

The insulating film 40 is provided between the conductive layer 20 and the semiconductor layer 10 and between the conductive layer 20 and the semiconductor region 30. The insulating film 40 is further provided under the back surface 10rs of the semiconductor layer 10.

The semiconductor device 1 further includes an element 50 provided on the semiconductor layer 10 and an electrode 60 provided on the front surface 10ss of the semiconductor layer 10. An insulating film 51 (a second insulating film) is provided on the semiconductor layer 10 and on the semiconductor region 30.

The element 50 is provided on the outside of the second region 1b where the semiconductor region 30 is disposed. The element 50 is a MOSFET. The element 50 uses the semiconductor layer 10 as a base region, and includes an n$^+$-type (second conductivity type) source region 50s, an n$^+$-type drain region 50d apart from the source region 50s, and a gate electrode 50g. The insulating film 51 provided between the semiconductor layer 10 and the gate electrode 50g is a gate insulating film. In the case where the semiconductor device 1 is part of a NAND flash memory device, the element 50 corresponds to a transistor that transfers an electric potential to the word line of a memory cell, for example.

In the semiconductor device 1, in addition to the element 50, for example, an active element such as a diode, a passive element such as a resistance and a capacitor, or a memory element, an interconnection, etc. are provided on the front surface 10ss side of the semiconductor layer 10 (not shown).

The electrode 60 is connected to the conductive layer 20. The electrode 60 is connected to an electrode 61 via a contact 70. The electrode 61 is connected to an electrode 62a via a contact 71. The electrode 62a is connected to an electrode 63 via a contact 72. The electrode 63 is connected to an electrode pad 66 via a contact 73. The electrode 63 is connected to an electrode 62b via a contact 74. The electrodes 60 to 63 and the contacts 70 to 74 are provided in an interlayer insulating film 80. The electrode pad 66 is exposed from the interlayer insulating film 80.

Although not illustrated, in addition to these, multiple interconnections are provided in a lower portion of the interlayer insulating film 80. A contact electrode is connected to each of the source region 50s, the drain region 50d, and the gate electrode 50g of the element 50.

In the semiconductor device 1, an insulating layer 90 is provided between part (for example, an upper portion) of the conductive layer 20 and the semiconductor region 30. When the semiconductor device 1 is viewed from the Z direction, the insulating layer 90 surrounds part of the conductive layer 20. An insulating layer 91 is provided between the semiconductor region 30 and the semiconductor layer 10. When the semiconductor device 1 is viewed from the Z direction, the insulating layer 91 surrounds the semiconductor region 30. The element 50 is partitioned from a region other than the element 50 by the insulating layer 91.

The semiconductor layer 10 and the semiconductor region 30 contain a silicon crystal doped with an impurity element such as boron (B), for example. The source region 50s and the drain region 50d contain a silicon crystal doped with an impurity element such as phosphorus (P) and arsenic (As), for example. The gate electrode 50g contains polysilicon doped with an impurity element, tungsten, or the like.

The conductive region 20a contains at least one of copper (Cu), tungsten (W), nickel (Ni), titanium (Ti), tin (Sn), polysilicon, and the like, for example. The conductive region 20a may be a stacked body in which at least one of copper (Cu), tungsten (W), nickel (Ni), titanium (Ti), tin (Sn), polysilicon, and the like is stacked, for example. The conductive region 20b contains at least one of titanium (Ti), titanium nitride (TiN), and the like. The conductive region 20b may be a stacked body in which at least one of titanium (Ti), titanium nitride (TiN), and the like is stacked.

The electrode pad 21 contains at least one of copper (Cu), tungsten (W), nickel (Ni), titanium (Ti), tin (Sn), polysilicon, and the like, for example. The electrode pad 21 may be a stacked body in which at least one of copper (Cu), tungsten (W), nickel (Ni), titanium (Ti), tin (Sn), polysilicon, and the like is stacked, for example.

The electrodes 60 to 63, the electrode pad 66, and the contacts 70 to 74 contain at least one of aluminum (Al), copper (Cu), tungsten (W), and polysilicon. The electrodes 60 to 63, the electrode pad 66, and the contacts 70 to 74 may be a stacked body in which at least one of aluminum (Al), copper (Cu), tungsten (W), polysilicon, and the like is stacked.

The insulating films 40 and 51, the insulating layers 90 and 91, and the interlayer insulating film 80 contain at least one of silicon oxide ($SiO_2$), silicon nitride ($Si_3N_4$), and the like, for example.

Before the operation of the semiconductor device 1 is described, a semiconductor device according to a reference example is described.

Figure 3:
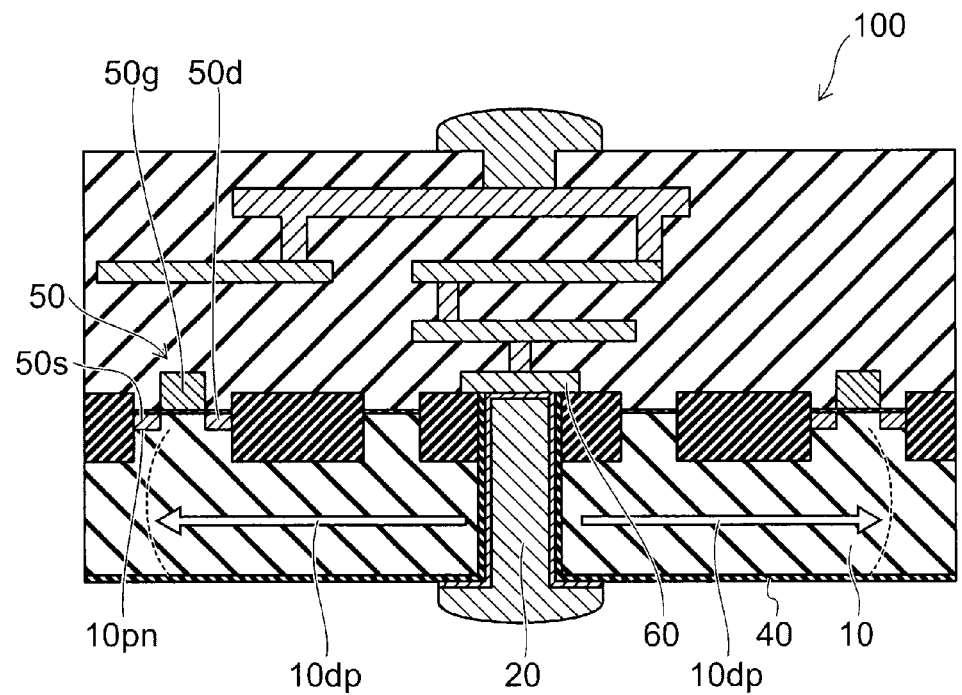
FIG. 3 is a schematic cross-sectional view showing a semiconductor device according to a reference example.

FIG. 3 is a schematic cross-sectional view showing a semiconductor device according to a reference example.

The basic structure of a semiconductor device 100 according to the reference example is the same as the basic structure of the semiconductor device 1. However, in the semiconductor device 100, the semiconductor region 30 described above is not provided.

In the case where the semiconductor device 100 is a NAND flash memory device, a high voltage of approximately 25 V, for example, is needed in the cell write and erase operations, and there is a case where a voltage of several tens of volts (e.g. approximately 30 V) is applied to the conductive layer 20 as a matter of course. In this case, a depletion layer is formed in a large area on the semiconductor layer 10 side so as to surround the conductive layer 20. The way in which the depletion layer extends is shown by arrow 10$dp$.

The depletion layer generally tends to extend longer as the impurity concentration becomes lower. In the embodiment, the extension of the depletion layer is schematically expressed by (10$dp$).

As described above, in regard to the semiconductor layer 10, since a transistor with a very small back bias effect is needed as an element formed on the same substrate, a semiconductor substrate with a very low impurity concentration is required in order to make the back bias effect of the transistor small.

Therefore, when a voltage of several tens of volts (e.g. approximately 30 V) is applied, a depletion layer 10$dp$ is formed in a large area on the semiconductor layer 10 side so as to surround the conductive layer 20, and in the worst case may reach the element 50 adjacent to the conductive layer 20.

In such a state, the operation of the element 50 becomes unstable, or rather the element 50 becomes inoperative and does not normally function as a NAND flash memory device.

As a method for avoiding such a phenomenon, there is a method that makes the distance between the conductive layer 20 and the element 50 longer. However, if this method is employed, an increase in the size of the semiconductor device is caused. In addition, from the necessity of making the distance between the conductive layer 20 and the element 50 a prescribed length or more, the flexibility of arrangement of the conductive layer 20, the element 50, and other portions is reduced.

Figure 4:
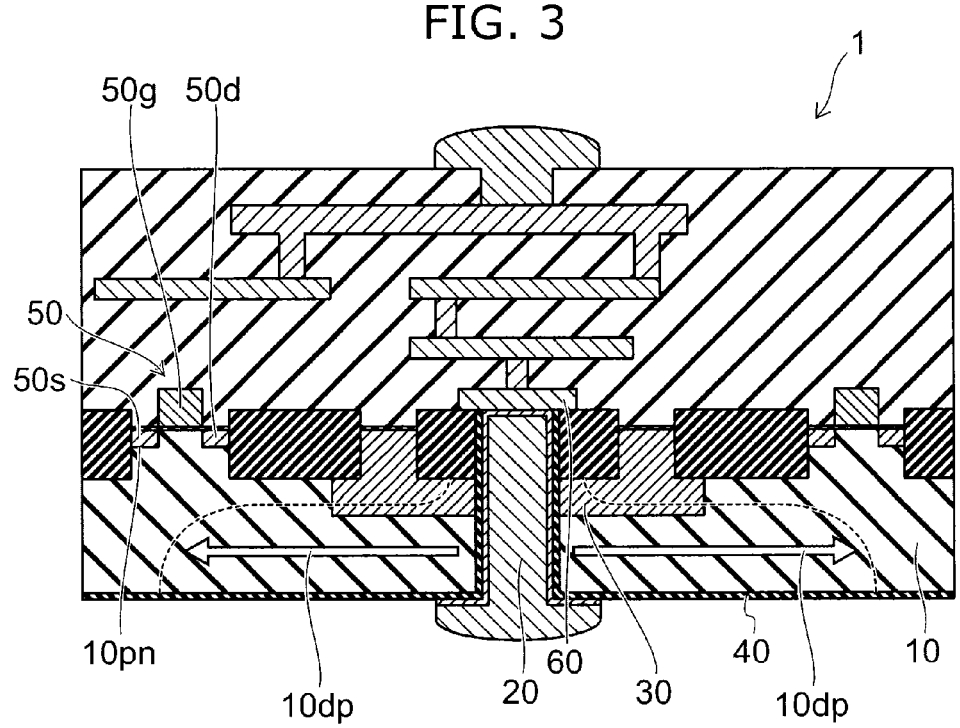
FIG. 4 is a schematic cross-sectional view showing the operation of the semiconductor device according to the first embodiment.

FIG. 4 is a schematic cross-sectional view showing the operation of the semiconductor device according to the first embodiment.

As compared to the reference example, the semiconductor device 1 includes the semiconductor region 30. The impurity concentration of the semiconductor region 30 is higher than the impurity concentration of the semiconductor layer 10.

Therefore, the extension of the depletion layer 10$dp$ in the semiconductor layer 10 is suppressed by the semiconductor region 30. Consequently, the extension of the depletion layer 10$dp$ in the semiconductor layer 10 in the semiconductor device 1 is suppressed as compared to the reference example. For example, FIG. 4 shows a state where the formation of the depletion layer 10$dp$ in the semiconductor layer 10 is sufficiently suppressed in the semiconductor region 30, and the depletion layer 10$dp$ exists only in a position sufficiently distant from the element 50 adjacent to the conductive layer 20.

Therefore, when a voltage of several tens of volts (e.g. approximately 30 V) is applied to the conductive layer 20, the depletion layer extending to the semiconductor layer 10 side is formed in a limited space. Thereby, the depletion layer 10$dp$ does not extend to such a level as to affect the element 50 adjacent to the conductive layer 20, and the operation of the element 50 is stabilized and the element 50 does not become inoperative. Consequently, a yield reduction due to the unstable operation and operational dysfunction of the element can be prevented. Furthermore, in the semiconductor device 1, it is not necessary to make the distance between the conductive layer 20 and the element 50 long. Thereby, the size of the semiconductor device 1 is not increased. Furthermore, in the semiconductor device 1, the flexibility of arrangement of the conductive layer 20, the element 50, and other portions is increased.

Thus, the increase in the chip area of the semiconductor device electrically connected by the through via is minimized, and thereby a semiconductor device that is inexpensive due to high yield and the reduction in the semiconductor chip area can be manufactured.

Second Embodiment

Figure 5:
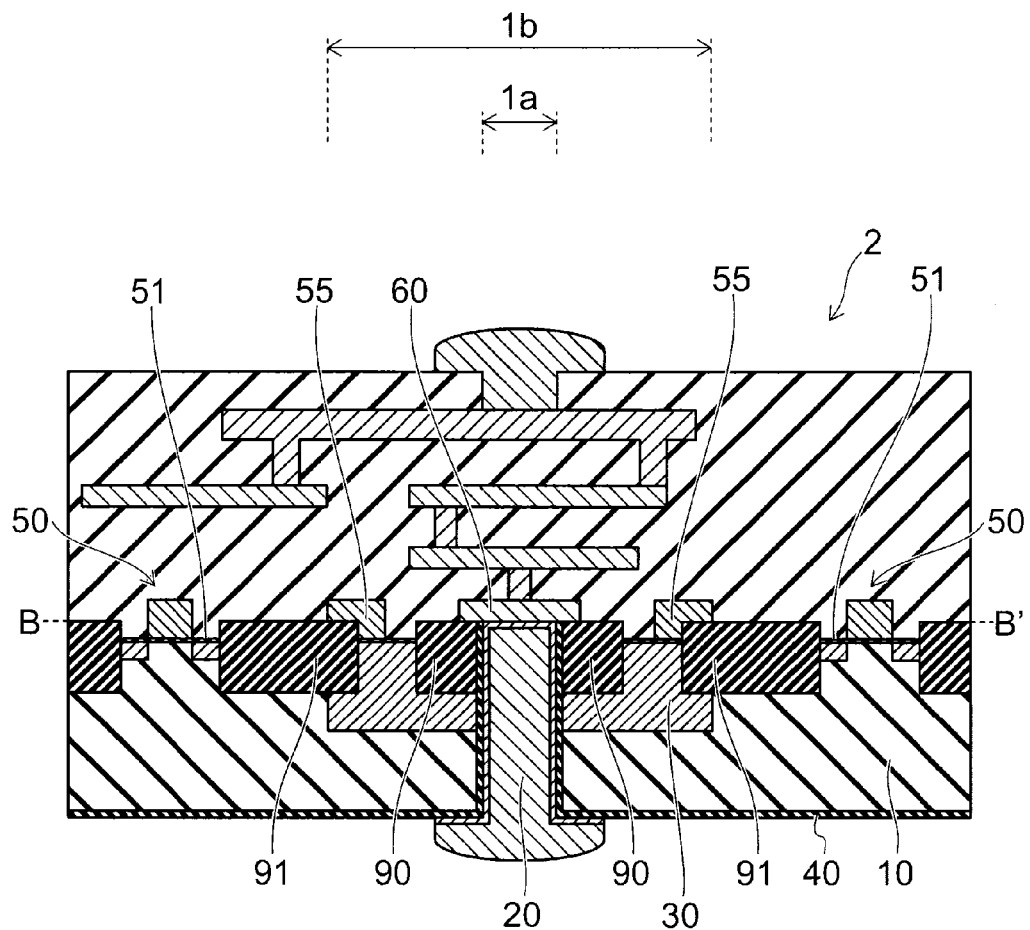
FIG. 5 is a schematic cross-sectional view showing a semiconductor device according to a second embodiment.

FIG. 5 is a schematic cross-sectional view showing a semiconductor device according to a second embodiment.

Figure 6:
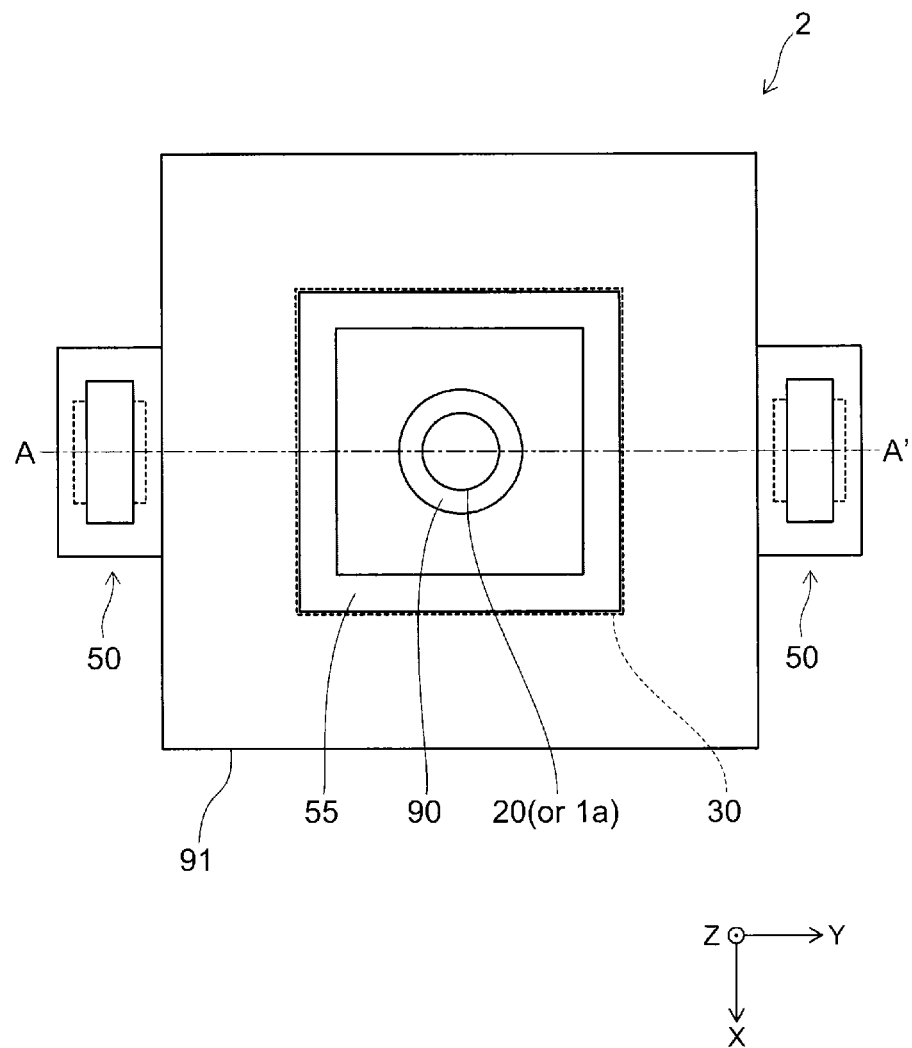
FIG. 6 is a schematic plan view showing the semiconductor device according to the second embodiment.

FIG. 6 is a schematic plan view showing the semiconductor device according to the second embodiment.

FIG. 5 shows a cross section in the position along line A-A' of FIG. 6. FIG. 6 shows a cross section in the position along line B-B' of FIG. 5.

The basic structure of a semiconductor device 2 according to the second embodiment is the same as the basic structure of the semiconductor device 1. The semiconductor device 2 further includes a conductive layer 55 (a second conductive layer). The conductive layer 55 is provided on the semiconductor region 30 via the insulating film 51. As viewed from the Z direction, the conductive layer 55 surrounds the first region is where at least one conductive layer 20 is provided. The conductive layer 55 contains polysilicon doped with an impurity element, tungsten, or the like.

In the semiconductor device 2, the conductive layer 55 may be grounded, or a prescribed potential may be applied to the conductive layer 55. Alternatively, the electric potential of the conductive layer 55 may be set to a floating potential. In the semiconductor device 2, by the conductive layer 20 being surrounded by the conductive layer 55, the electric potential of the conductive layer 20 is shielded by the conductive layer 55. Therefore, the depletion layer 10$dp$ formed on the element 50 side due to the electric potential of the conductive layer 20 is suppressed to a more limited one.

Thereby, in the semiconductor device 2, the depletion layer extending to the semiconductor layer 10 side is formed in a more limited space than in the semiconductor device 1, and this leads to stable operation of the semiconductor device. Furthermore, in the semiconductor device 2, the distance between the conductive layer 20 and the element 50 can be set still shorter, and therefore the device size is further reduced. Furthermore, in the semiconductor device 2, the flexibility of arrangement of the conductive layer 20, the element 50, and other portions is further increased. Thereby, the chip area of the semiconductor device electrically connected by the through via can be made still smaller, and a semiconductor device that is inexpensive due to high yield and the reduction in the semiconductor chip area can be manufactured.

The conductive layer 55 is located at the same height as the memory cell transistor. Hence, the conductive layer 55 can be formed along with the memory cell transistor in the process of forming the memory cell transistor. Therefore, even when the conductive layer 55 is provided, a cost increase of the manufacturing process does not occur.

Third Embodiment

Figure 7:
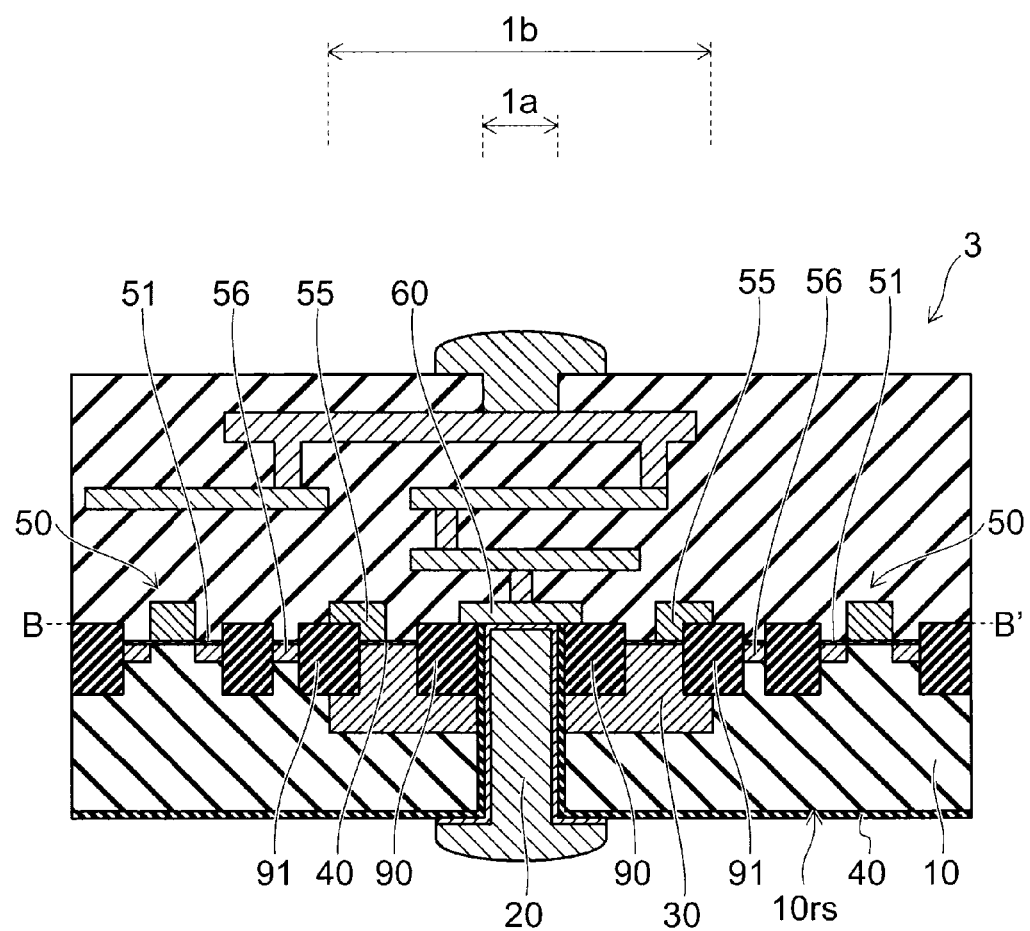
FIG. 7 is a schematic cross-sectional view showing a semiconductor device according to a third embodiment.

FIG. 7 is a schematic cross-sectional view showing a semiconductor device according to a third embodiment.

Figure 8:
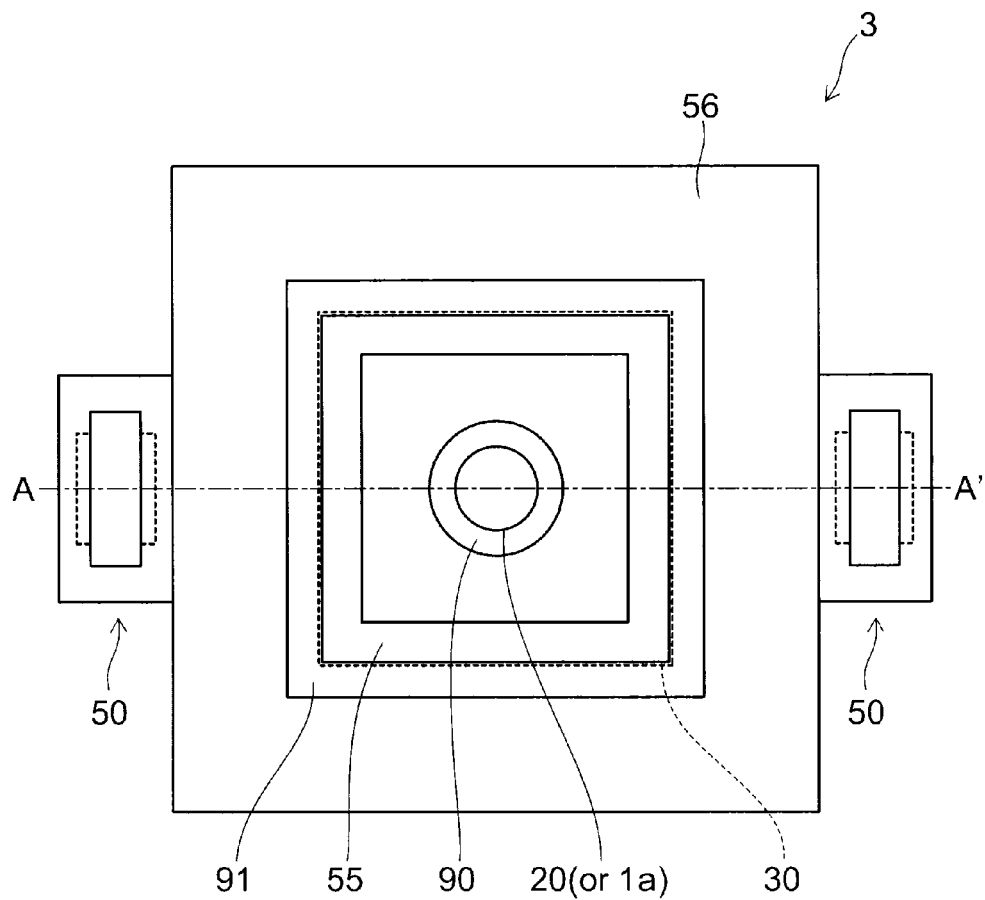
FIG. 8 is a schematic plan view showing the semiconductor device according to the third embodiment.

FIG. 8 is a schematic plan view showing the semiconductor device according to the third embodiment.

FIG. 7 shows a cross section in the position along line A-A' of FIG. 8. FIG. 8 shows a cross section in the position along line B-B' of FIG. 7.

The basic structure of a semiconductor device 3 according to the third embodiment is the same as the basic structure of the semiconductor device 1. The semiconductor device 3 further includes a $p^+$-type semiconductor region 56 (a second semiconductor region). The semiconductor region 56 contains a silicon crystal doped with an impurity element such as boron (B), for example.

The semiconductor region 56 is provided on the semiconductor region 10. The impurity concentration of the semiconductor region 56 is higher than the impurity concentration of the semiconductor region 30. The semiconductor region 56 is a conductive region.

The semiconductor region 56 surrounds the first region 1a and the second region 1b where the semiconductor region 30 is provided. In the semiconductor device 3, the element 50 provided on the semiconductor layer 10 is provided on the outside of the semiconductor region 56 surrounding the first region 1a and the second region 1b.

In the semiconductor device 3, the semiconductor region 56 may be grounded, or a prescribed potential may be applied to the semiconductor region 56. In the semiconductor device 3, by the conductive layer 20 being surrounded by the conductive layer 55 and the semiconductor region 56, the electric potential of the conductive layer 20 is shielded by the conductive layer 55 and the semiconductor region 56. Therefore, the depletion layer 10dp formed on the element 50 side due to the electric potential of the conductive layer 20 is suppressed to a more limited one.

Thereby, in the semiconductor device 3, when a voltage of several tens of volts (e.g. approximately 30 V) is applied to the conductive layer 20, the depletion layer extending to the semiconductor layer 10 side is formed in a limited space. Thereby, the depletion layer 10dp does not extend to such a level as to affect the element 50 adjacent to the conductive layer 20, and the operation of the element 50 is stabilized and the element 50 does not become inoperative. Furthermore, in the semiconductor device 3, the distance between the conductive layer 20 and the element 50 can be set still shorter, and therefore the device size is further reduced. Furthermore, in the semiconductor device 3, the flexibility of arrangement of the conductive layer 20, the element 50, and other portions is further increased. Thereby, the chip area of the semiconductor device electrically connected by the through via can be made still smaller, and a semiconductor device that is inexpensive due to high yield and the reduction in the semiconductor chip area can be manufactured.

Fourth Embodiment

Figure 9:
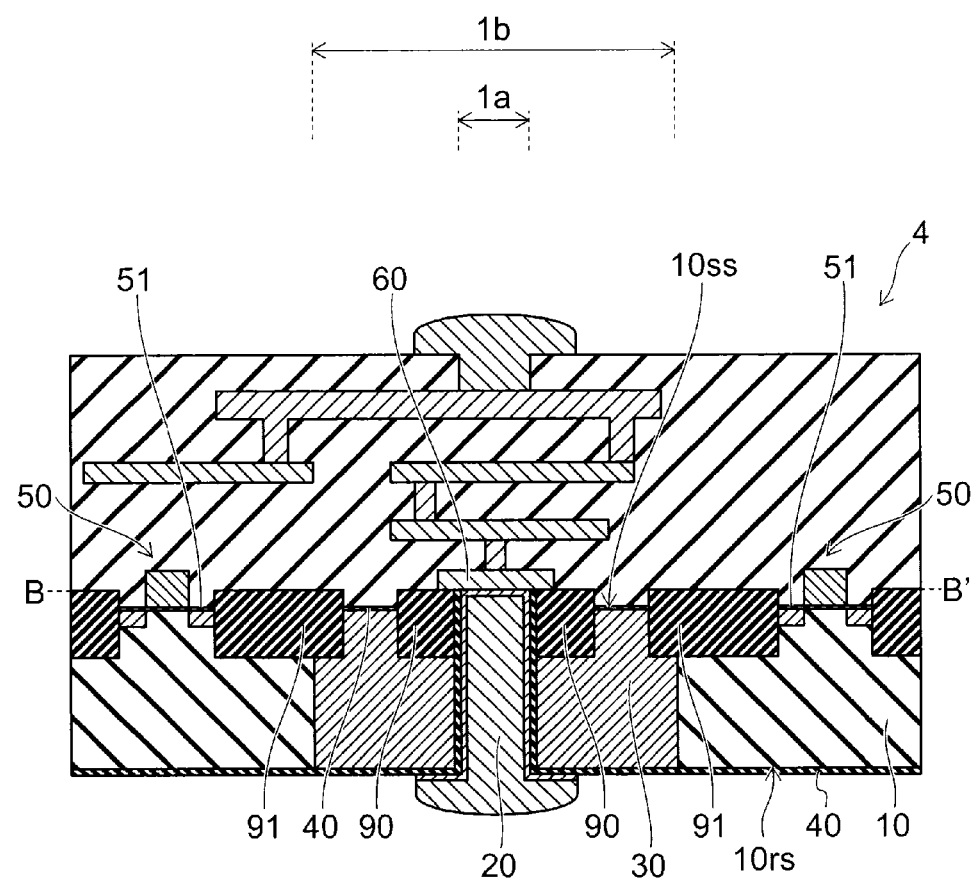
FIG. 9 is a schematic cross-sectional view showing a semiconductor device according to a fourth embodiment.

FIG. 9 is a schematic cross-sectional view showing a semiconductor device according to a fourth embodiment.

In a semiconductor device 4, the semiconductor region is provided between the conductive layer 20 and the semiconductor layer 10. In the case where the semiconductor region 30 is disposed so as to surround the entire conductive layer 20 like the semiconductor device 4, the depletion layer extending from the conductive layer 20 is kept in a more limited region. Therefore, the depletion layer 10dp formed on the element 50 side due to the electric potential of the conductive layer 20 is suppressed to a more limited one.

In the embodiment, the p type is taken as the first conductivity type and the n type is taken as the second conductivity type. Also structures in which the p type and the n type are exchanged to take the n type as the first conductivity type and the p type as the second conductivity type are included in the embodiment.

The term "on" in "a portion A is provided on a portion B" refers to the case where the portion A is provided on the portion B such that the portion A is in contact with the portion B and the case where the portion A is provided above the portion B such that the portion A is not in contact with the portion B.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising a semiconductor layer, the semiconductor layer including:

a semiconductor substrate of a first conductivity type, and the semiconductor substrate having a first surface and a second surface on an opposite side to the first surface;

a first conductive layer piercing from the first surface side to the second surface side of the semiconductor substrate;

a first semiconductor region of a first conductivity type surrounding part of the first conductive layer on the second surface side of the semiconductor substrate, a portion other than a front surface of the first semiconductor region being surrounded by the semiconductor substrate;

a first insulating film provided between the first conductive layer and the semiconductor substrate and between the first conductive layer and the first semiconductor region;

a first insulating layer provided on the first semiconductor region, the first insulating layer surrounding the first conductive layer via the first insulating film, the first conductive layer piercing the first insulating layer, the first insulating film provided between the first conductive layer and the first insulating layer along a whole thickness of the first insulating layer taken in a direction from the second surface side toward the first surface side, the second surface being an uppermost surface of the semiconductor substrate, and a concentration of an impurity element contained in the first semiconductor region being higher than a concentration of an impurity element contained in the semiconductor substrate;

a second insulating film provided on the semiconductor substrate and on the first semiconductor region;

a second conductive layer provided on the first semiconductor region via the second insulating film, the second conductive layer surrounding a first region, and the first conductive layer is provided in the first region; and a second semiconductor region of a first conductivity type provided on the semiconductor substrate and surrounding a second region, the first semiconductor region being provided in the second region, an impurity concentration of the second semiconductor region being higher than an impurity concentration of the first semiconductor region.

2. The device according to claim 1, further comprising an element provided on an outside of the first semiconductor region and provided on the semiconductor substrate.

3. The device according to claim 1, further comprising an element provided on an outside of the second conductive layer surrounding the first region and provided on the semiconductor substrate.

4. The device according to claim 1, further comprising an element provided on an outside of a second semiconductor region surrounding the first region and the second region and provided on the semiconductor substrate.

5. The device according to claim 1, further comprising another first conductive layer piercing from the first surface side to the second surface side of the semiconductor substrate.

6. A semiconductor device comprising a semiconductor layer, the semiconductor layer including:

a semiconductor substrate of a first conductivity type having a first surface and a second surface on an opposite side to the first surface;

a first conductive layer piercing from the first surface side to the second surface side of the semiconductor substrate;

a first semiconductor region of a first conductivity type provided between the semiconductor substrate and the first conductive layer;

a first insulating film provided between the first conductive layer and the semiconductor substrate and between the first conductive layer and the first semiconductor region;

a first insulating layer provided on the first semiconductor region, the first insulating layer surrounding the first conductive layer via the first insulating film, the first conductive layer piercing the first insulating layer, the first conductive layer including a main body and a barrier layer, the second surface being an uppermost surface of the semiconductor substrate, and a concentration of an impurity element contained in the first semiconductor region being higher than a concentration of an impurity element contained in the semiconductor substrate;

a second insulating film provided on the semiconductor substrate and on the first semiconductor region;

a second conductive layer provided on the first semiconductor region via the second insulating film, the second conductive layer surrounding a first region, and the first conductive layer is provided in the first region; and a second semiconductor region of a first conductivity type provided on the semiconductor substrate and surrounding a second region, the first semiconductor region being provided in the second region, an impurity concentration of the second semiconductor region being higher than an impurity concentration of the first semiconductor region.

7. The device according to claim 6, wherein the first semiconductor region surrounds the first conductive layer.

8. The device according to claim 6, further comprising an element provided on an outside of a first region and a second region, the first conductive layer is provided in the first region, the first semiconductor region is provided in the second region, and provided on the semiconductor substrate.

9. A semiconductor device comprising a semiconductor layer, the semiconductor layer including:

a semiconductor substrate of a first conductivity type, and the semiconductor substrate having a first surface and a second surface on an opposite side to the first surface;

a first conductive layer piercing from the first surface side to the second surface side of the semiconductor substrate;

a first semiconductor region of a first conductivity type surrounding part of the first conductive layer on the second surface side of the semiconductor substrate, a portion other than a front surface of the first semiconductor region being surrounded by the semiconductor substrate;

a first insulating film provided between the first conductive layer and the semiconductor substrate and between the first conductive layer and the first semiconductor region;

a second insulating film provided on the semiconductor substrate and on the first semiconductor region;

a second conductive layer provided on the first semiconductor region via the second insulating film, the second conductive layer surrounding a first region, and the first conductive layer being provided in the first region; and a second semiconductor region of a first conductivity type provided on the semiconductor substrate and surrounding a second region, and the first semiconductor region is provided in the second region, the second surface being an uppermost surface of the semiconductor substrate, a concentration of an impurity element contained in the first semiconductor region being higher than a concentration of an impurity element contained in the semiconductor substrate, and an impurity concentration of the second semiconductor region being higher than an impurity concentration of the first semiconductor region.

10. The device according to claim 9, further comprising an element provided on an outside of a second semiconductor region surrounding the first region and the second region and provided on the semiconductor substrate.

11. The device according to claim 1, wherein the first semiconductor region is formed at the second surface of the semiconductor substrate around the first insulating layer.

12. The device according to claim 6, wherein the first semiconductor region is formed at the second surface of the semiconductor substrate around the first insulating layer.

13. The device according to claim 6, wherein the barrier layer is provided on a side surface of the main body, and provided on a surface of the main body on a side of the second surface of the semiconductor substrate.

\* \* \* \* \*